United States Patent
Ho

(10) Patent No.: US 8,147,266 B2
(45) Date of Patent: Apr. 3, 2012

(54) FASTENER FOR A SOCKET CONNECTOR

(75) Inventor: Yi-Tse Ho, Taipei (TW)

(73) Assignee: Molex Incorporated, Lisle, IL (US)

( * ) Notice: Subject to any disclaimer, the term of this patent is extended or adjusted under 35 U.S.C. 154(b) by 0 days.

(21) Appl. No.: 13/215,812

(22) Filed: Aug. 23, 2011

(65) Prior Publication Data

US 2011/0306231 A1    Dec. 15, 2011

Related U.S. Application Data

(62) Division of application No. 12/220,605, filed on Jul. 25, 2008.

(30) Foreign Application Priority Data

Jul. 27, 2007    (TW) ................................ 96212411 U

(51) Int. Cl.
    *H01R 13/62*    (2006.01)
(52) U.S. Cl. .......................................... 439/331; 439/73
(58) Field of Classification Search .................. 439/331, 439/330, 342, 73
    See application file for complete search history.

(56) References Cited

U.S. PATENT DOCUMENTS

| 5,009,608 A * | 4/1991 | Shipe ............................ 439/331 |
| 5,120,238 A * | 6/1992 | Marks et al. .................. 439/331 |
| 6,905,353 B2 | 6/2005 | Ma et al. |
| 7,025,603 B2 | 4/2006 | Ma |
| 7,030,638 B2 * | 4/2006 | Stutzman ................. 324/756.02 |
| 7,267,554 B2 | 9/2007 | Huang |
| 7,338,308 B2 * | 3/2008 | Nakao et al. .................. 439/331 |
| 7,658,632 B2 | 2/2010 | Xu et al. |
| 7,815,456 B2 * | 10/2010 | Kunioka et al. ............... 439/331 |

* cited by examiner

*Primary Examiner* — Xuong Chung Trans
(74) *Attorney, Agent, or Firm* — Stephen L. Sheldon

(57) ABSTRACT

A fastener for a socket connector includes a frame and a pressing assembly. The frame has an opening and a plurality of protrusions. The protrusions extend from inner edges of the frame toward the opening. The pressing assembly has a cover and a buckling piece. The cover is pivotally connected to the frame. The buckling piece locks the cover on the frame. Using the above arrangement, the protrusions are used to accurately align the socket connector within the opening, thus the inter edge surface of the frame is aligned with the outer peripheral surface of the socket connector. In this way, the pressing assembly of the frame can be operated accurately to lock and press a chip module on the socket connector.

3 Claims, 6 Drawing Sheets

FASTENER FOR A SOCKET CONNECTOR

RELATED APPLICATIONS

This application is a divisional application of U.S. patent application Ser. No. 12/220,605, filed Jul. 25, 2008, which is incorporated herein by reference in its entirety, and which claims priority to Taiwan Patent Application No. 96212411, filed Jul. 27, 2007.

FIELD OF THE INVENTION

The present invention relates to a fastener for a socket connector, and in particular to a fastener for pressing a chip module on a socket connector.

BACKGROUND OF THE INVENTION

A chip module is electrically connected with a circuit board via a socket connector. The socket connector has an insertion slot. The chip module is inserted into the insertion slot. In order to firmly insert the chip module into the insertion slot of the socket connector, a fastener is provided on the peripheral surface of the socket connector after the socket connector is soldered on the circuit board. The fastener comprises a frame that is fixedly connected to the circuit board by screws. The frame is further provided with a cover and a buckling piece, thereby locking and pressing the chip module on the socket connector.

However, when the conventional frame is disposed on the outer peripheral surface of the socket connector, it may be disposed obliquely or deviated easily, so that the inner edge surface of the frame cannot be aligned with the outer peripheral surface of the socket connector. As a result, the cover and the buckling piece of the frame cannot lock and press the chip module on the socket connector accurately as a result of this misalignment.

SUMMARY OF THE INVENTION

The object of the present invention is to provide a fastener for a socket connector, whereby the frame can be disposed on the outer peripheral surface of the socket connector accurately.

In order to achieve the above objects, the present invention provides a fastener for a socket connector, which includes a frame having an opening and a plurality of protrusions, the protrusions extending from inner edges of the frame toward the opening; and a pressing assembly having a cover and a buckling piece, the cover being pivotally connected to the frame, and the buckling piece locking the cover on the frame. The protrusions allow the frame to be accurately disposed outside the socket connector, so that the inner edge surface of the frame can be aligned with the outer peripheral surface of the socket connector accurately. As a result, the pressing assembly of the frame can be operated accurately, thereby locking and pressing the chip module on the socket connector.

In order to further understand the characteristics and technical contents of the present invention, a detailed description relating thereto will be made with reference to the accompanying drawings. However, the drawings are illustrative only, but not used to limit the scope of the present invention.

BRIEF DESCRIPTION OF THE DRAWINGS

The organization and manner of the structure and operation of the invention, together with further objects and advantages thereof, may best be understood by reference to the following description taken in connection with the accompanying drawings wherein like reference numerals identify like elements in which.

DETAILED DESCRIPTION OF THE PREFERRED EMBODIMENTS

Figure 1:
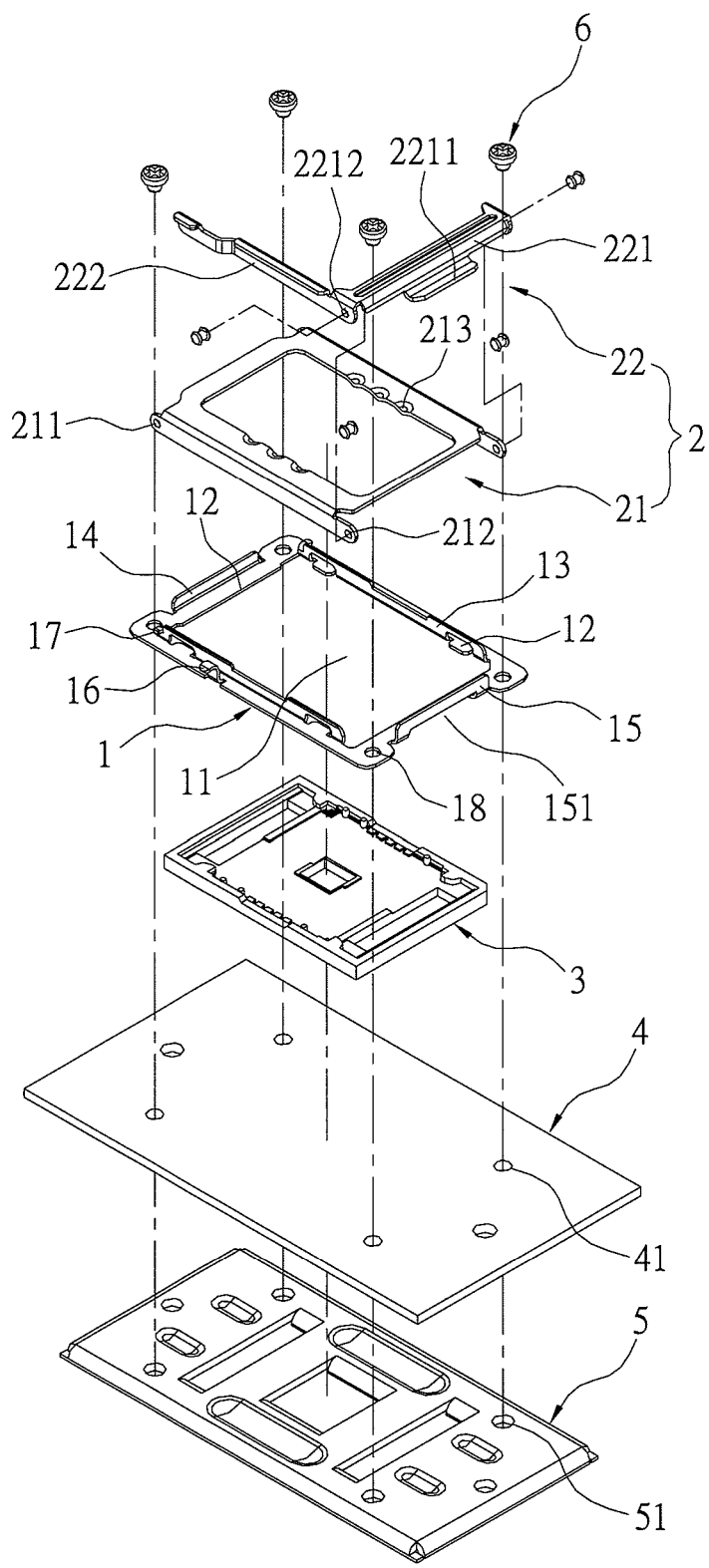
FIG. 1 is an exploded perspective view showing the fastener for a socket connector according to the first embodiment of the present invention.
Figure 2:
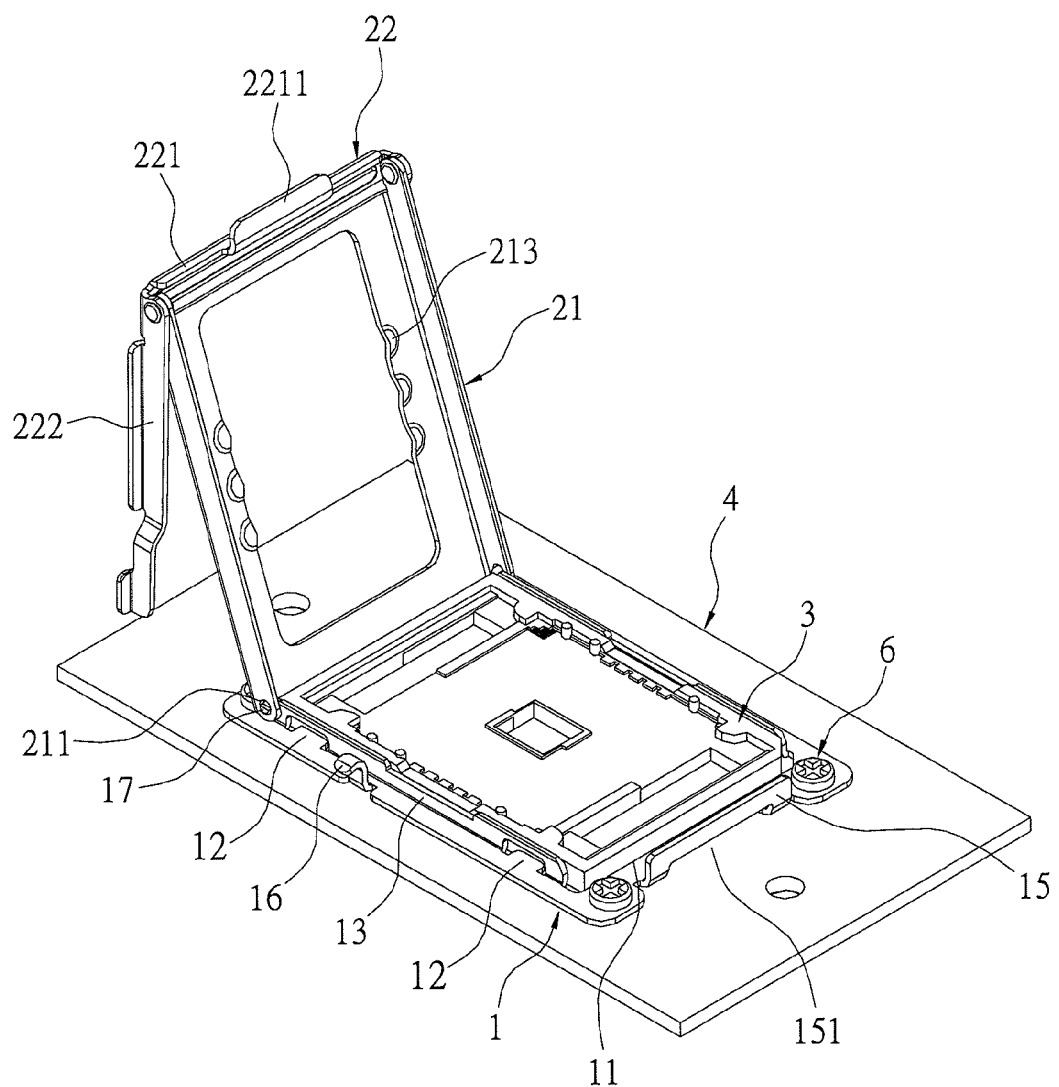
FIG. 2 is a schematic view showing the fastener for a socket connector according to the first embodiment of the present invention in an open state.

While this invention may be susceptible to embodiment in different forms, there is shown in the drawings and will be described herein in detail, a specific embodiment with the understanding that the present disclosure is to be considered an exemplification of the principles of the invention, and is not intended to limit the invention to that as illustrated.

As shown in FIGS. 1 to 7, the present invention provides a fastener for a socket connector, which includes a frame 1 and a pressing assembly 2.

Figure 3:
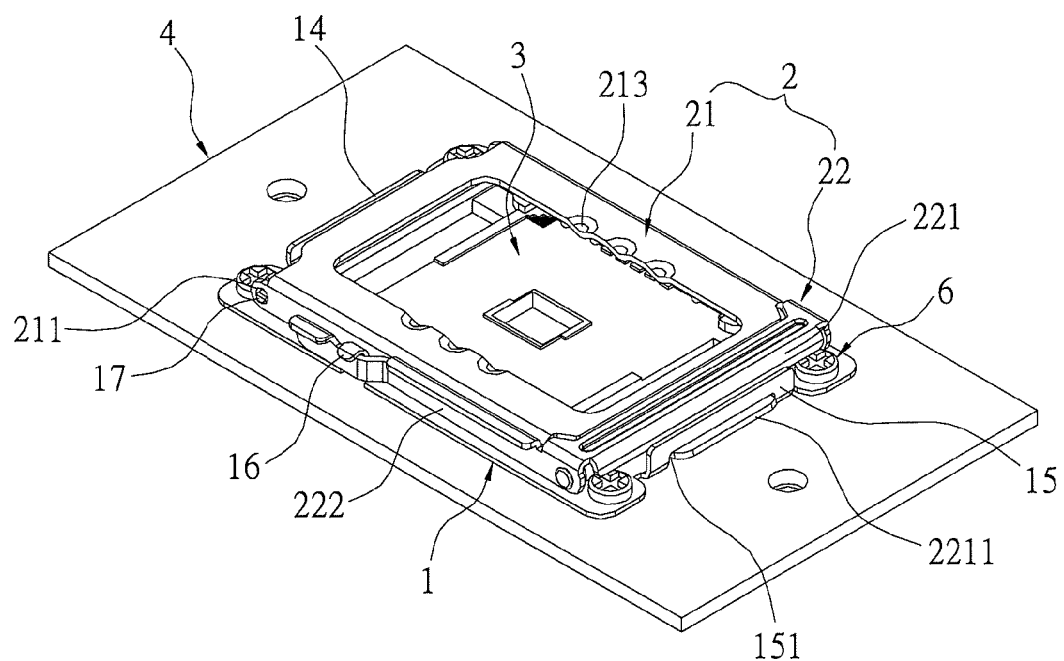
FIG. 3 is a schematic view showing the fastener for a socket connector according to the first embodiment of the present invention in a closed state.
Figure 4:
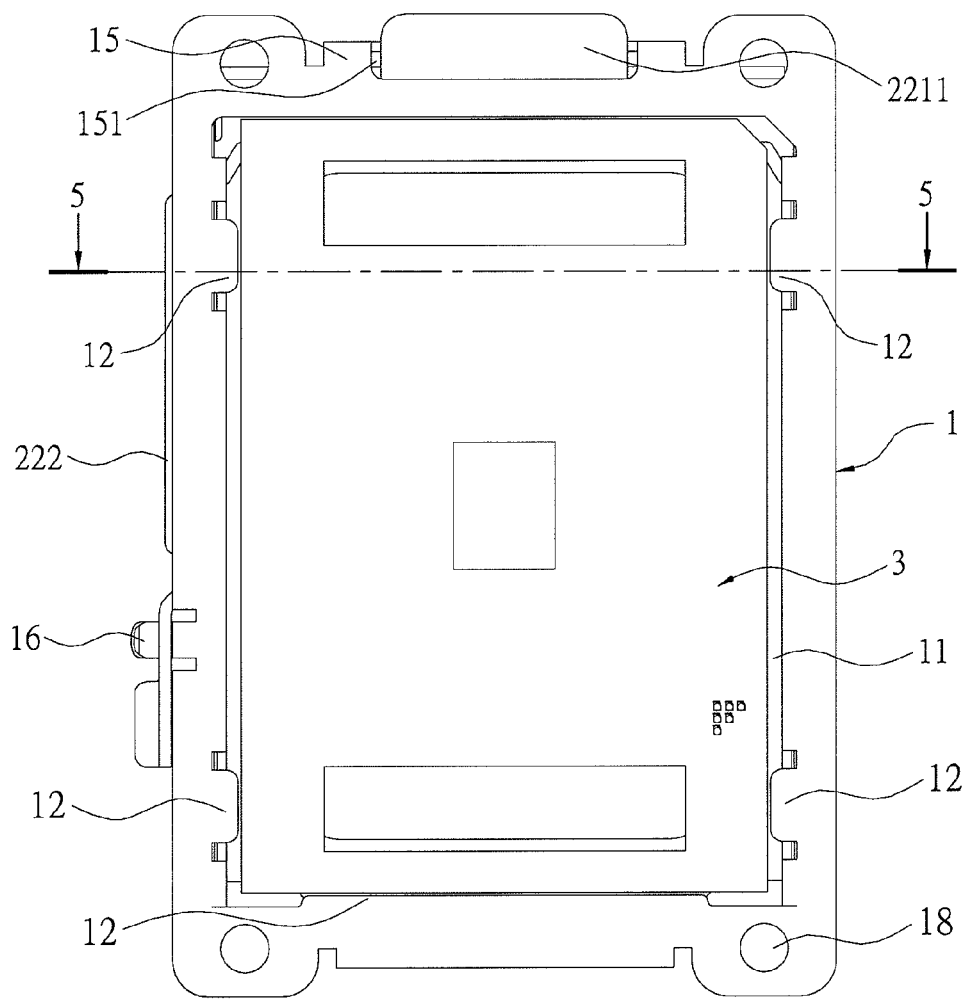
FIG. 4 is a bottom view showing the fastener for a socket connector according to the first embodiment of the present invention.
Figure 5:
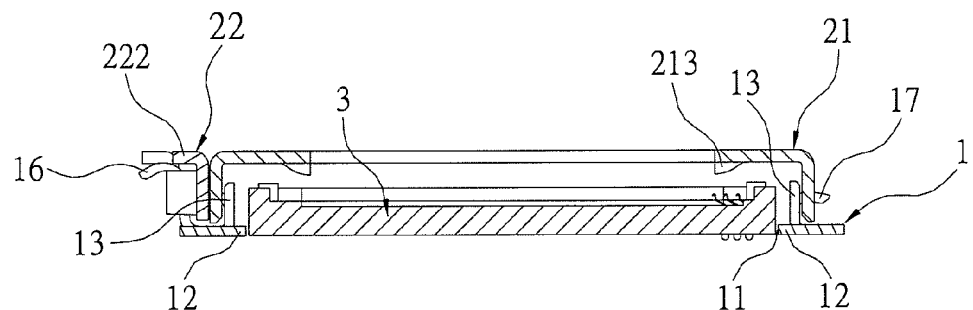
FIG. 5 is a cross-sectional view taken along the line 5-5 in FIG. 4.

Referring to FIGS. 1 to 5, the frame 1 is provided on a circuit board 4. The frame 1 has a square opening 11 penetrating its top and bottom. The interior of the opening 11 is used to accommodate a socket connector 3 that is soldered to the circuit board 4. The frame 1 has a plurality of protrusions 12 and two partitioning walls 13. The inner edges of both sides of the frame 1 are provided with a pair of protrusions 12 respectively. The inner edge of one end of the frame 1 is provided with a protrusion 12. The protrusions 12 extend from the inner edges of the frame 1 toward the opening 11 and approach the outer peripheral surface of the socket connector 3 (FIGS. 4 and 5).

Referring to FIGS. 1 and 3, the frame 1 has two partitioning walls 13 located on side portions, an abutting portion 14 on one end portion, a blocking plate 15 on the other end portion, a locking portion 16, a pair of connecting portions 17, and a plurality of first screw holes 18. The two partitioning walls 13 extend upwardly from both sides of the frame 1. The abutting portion 14 extends upwardly from one end of the frame 1. The blocking plate 15 extends upwardly from the other end of the frame 1 with respect to the abutting portion 14, and has an opening 151 penetrating the blocking plate 15. The locking portion 16 is formed by means of extending upwardly and bending from one side of the frame 1. The pair of connecting portions 17 extends from both sides of one end of the frame 1. The four corners of the frame 1 are provided with a first screw hole 18 respectively. The four first screw holes 18 penetrate the top and bottom surfaces of the frame 1.

The pressing assembly 2 comprises a cover 21 and a buckling piece 22. The cover 21 is pivotally connected on the frame 1. The buckling piece 22 is used to lock the cover 21 on the frame 1.

One end of the cover 21 is pivotally connected to one end of the frame 1. The cover 21 has a pair of holes 211, a pair of first pivotal holes 212, and a plurality of abutting portions 213. The pair of holes 211 is provided on one end of the cover 21. The pair of holes 211 is connected onto the connecting portions 17 at one end of the frame 1, so that the cover 21 can rotate on the frame 1. The top surface of the cover 21 abuts on the abutting portion 14 to limit the rotating range of the cover 2. The pair of first pivotal holes 212 is provided on both sides of the other end of the cover 21, thereby pivotally connecting to the buckling piece 22. The abutting portions 213 are formed by means of protruding downwards from the bottom surface of the cover 21.

The buckling piece 22 is pivotally connected to the other end of the cover 21. The buckling piece 22 has a pivoting plate 221 and a rocking plate 222. The pivoting plate 221 has a tongue 2211 and a pair of second pivotal holes 2212. The tongue 2211 extends from the pivoting plate 221 to correspond to the blocking plate 15. The pair of second pivotal holes 2212 is provided on both sides of the pivoting plate 221. The pair of second pivotal holes 2212 and the pair of first pivotal holes 212 correspond to each other and are pivotally connected with each other via rivets or other connecting elements. The rocking plate 222 extends from one side of the pivoting plate 221 and can be locked on the locking portion 16.

Referring to FIG. 3, both sides of the cover 21 overlap the partitioning walls 13 on both sides of the frame 1. The tongue 2211 of the buckling piece 22 can be blocked in the opening 151. The rocking plate 222 can be pressed and locked in the locking portion 16 by using the tongue 2211 as a fulcrum. In this way, the cover 21 can be firmly pressed on the frame 1.

The circuit board 4 has a plurality of second screw holes 41. The bottom end of the circuit board 4 is provided with a back plate 5. The back plate 5 is provided with a plurality of third screw holes 51 to correspond to the second screw holes 41. The first screw holes 18 of the frame 1 are aligned with the second and third screw holes 41, 51 and screws 6 are inserted therein, thereby connecting the circuit board 4 with the back plate 5.

Incidentally, the back plate 5 is removable. The screw 6 passes through the frame 1 and the circuit board 4 directly and thus is locked on a housing (not shown) or secured by a nut.

Referring to FIGS. 4 and 5, when the frame 1 is to be disposed on the circuit board 4, since the protrusions 12 on one end and both sides of the frame 1 are provided corresponding to the outer peripheral surface of the socket connector 3, the frame 1 can be aligned with the socket connector 3 accurately to be disposed on the circuit board 4. The socket connector 3 further supports a chip module (not shown). The abutting portion 213 of the cover 21 abuts the chip module on the socket connector 3 so as to be locked and covered thereon.

Figure 6:
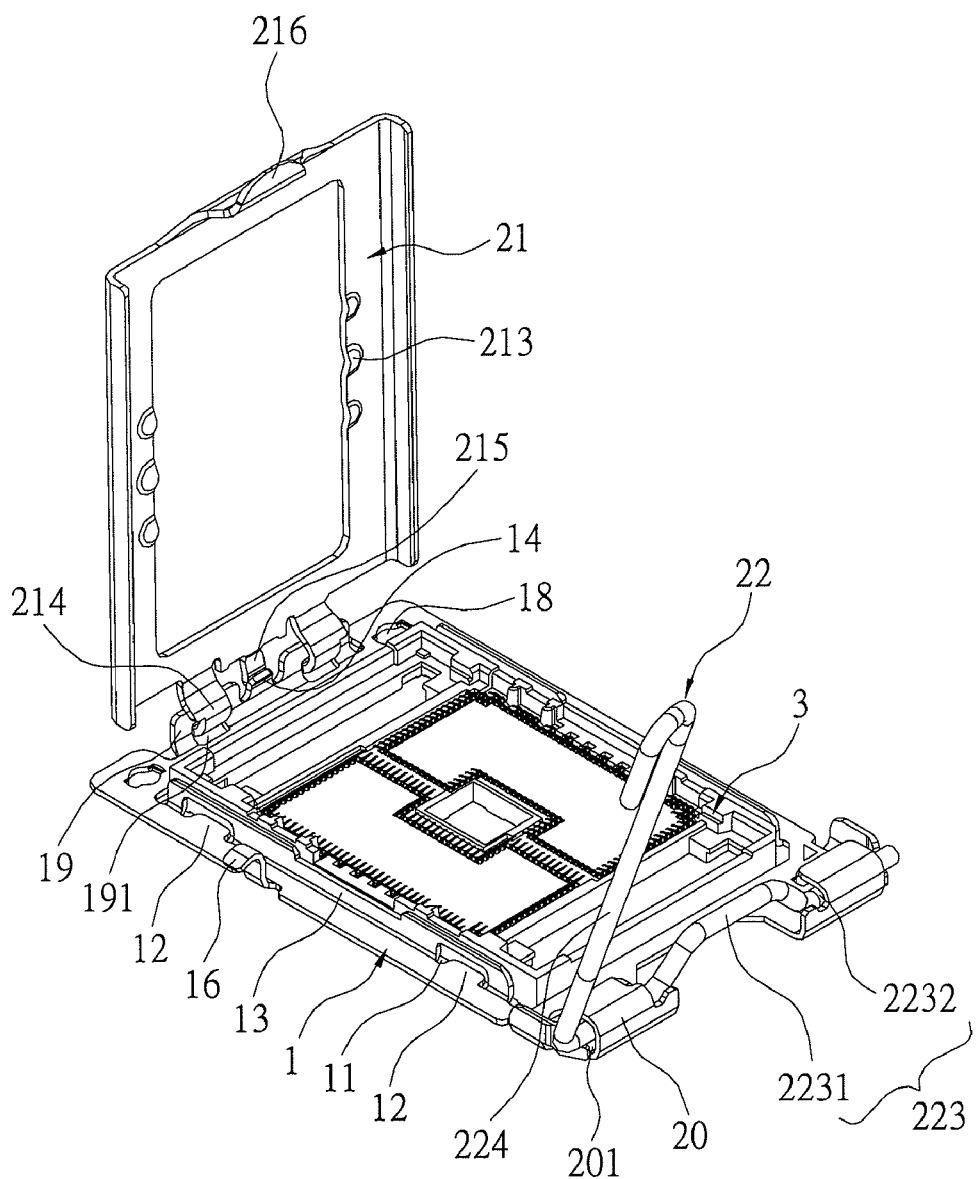
FIG. 6 is a perspective view showing the fastener for a socket connector according to an alternative embodiment of the present invention.
Figure 7:
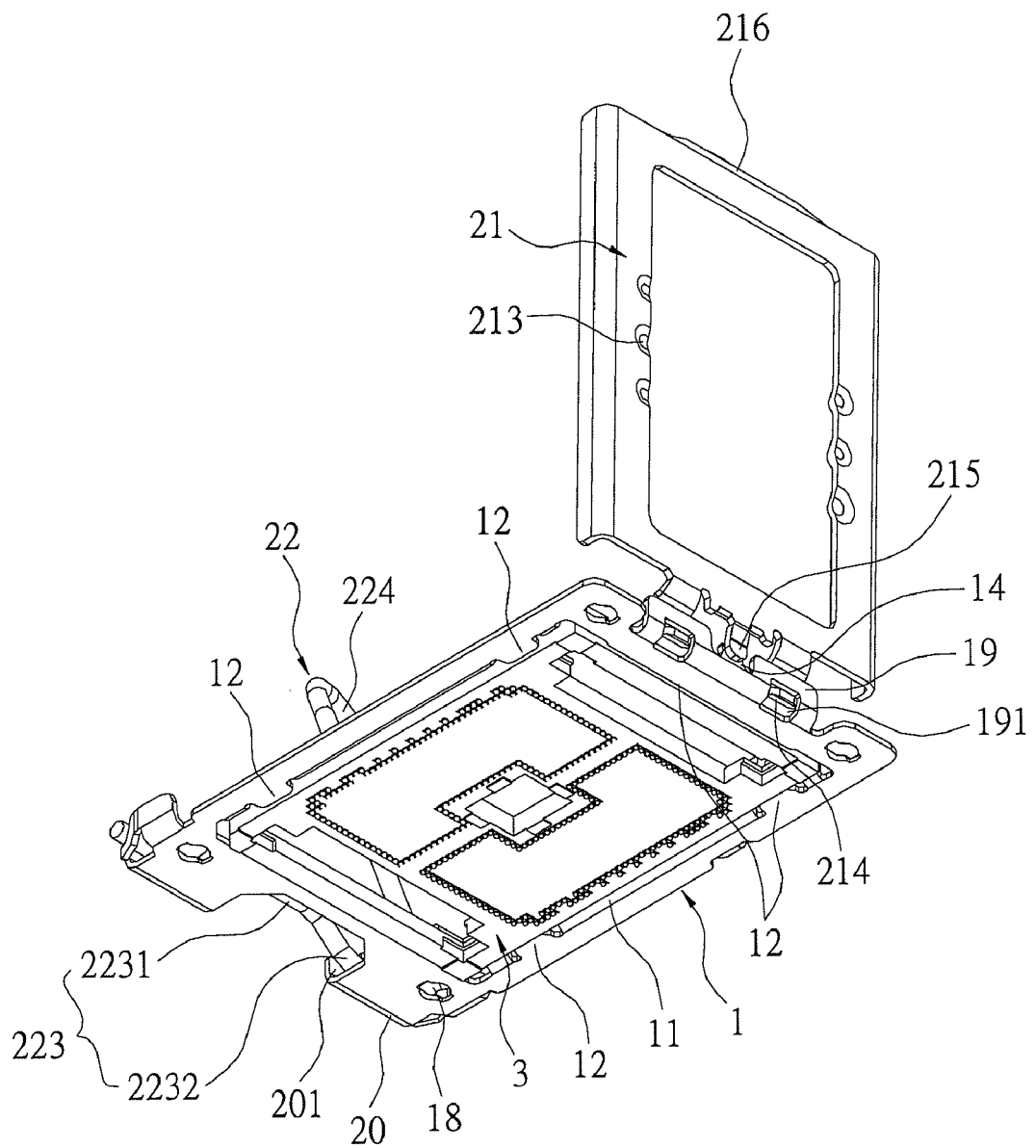
FIG. 7 is a perspective view showing the fastener for a socket connector according to an alternative embodiment of the present invention in another viewing angle.

Referring to FIGS. 6 and 7, one end of the frame 1 extends to form an abutting portion 14 and a pair of hooking portions 19. The hooking portion 19 has an opening 191. One end of the cover 21 extends to form a pair of hooks 214 and a stopper 215. The pair of hooks 214 is inserted in the openings 191 of the hooking portion 19, so that the one end of the cover 21 can be pivotally connected with one end of the frame 1 in a rotatable way. The stopper 215 is stopped by the abutting portion 14, thereby limiting the rotating range of the cover 21.

The buckling piece 22 is pivotally connected to the other end of the frame 1. The other end of the frame 1 has a pair of reversely-folded portions 20. The reversely-folded portion 20 has a through hole 201. The buckling piece 22 is an integral rod, which has a pivoting rod 223 and a rocking rod 224. The pivoting rod 223 has a pressing portion 2231 and pivoting portions 2232 formed on both sides of the pressing portion 2231. The two pivoting portions 2232 are pivotally provided in the two through holes 201. The pressing portion 2231 is provided between the two reversely-folded portions 20.

Incidentally, the way of pivotally connecting the frame 1, the cover 21 and the buckling piece 22 is not limited to the means disclosed herein, but other suitable connecting means can be used.

The other end of the cover 21 extends to form an extending portion 216. The pressing portion 2231 exerts a force on the extending portion 216 by means of rotating the rocking rod 224. The rocking rod 224 is locked to the locking portion 16, thereby pressing the cover 21 on the frame 1.

According to the above, when the socket connector 3 is firmly soldered to the circuit board 4, the frame 1 is disposed on the circuit board 4 to surround the outer peripheral surface of the socket connector 3. Since the protrusions 12 of the frame 1 can be disposed outside the socket connector 3 quickly and accurately, the inner edge surface of the frame 1 is flush with the outer peripheral surface of the socket connector 3. In this way, the pressing assembly 2 of the frame 1 can be operated accurately to lock and press the chip module on the socket connector 1.

While a preferred embodiment of the invention is shown and described, it is envisioned that those skilled in the art may devise various modifications without departing from the spirit and scope of the foregoing description and the appended claims.

What is claimed is:

1. A fastener for a socket connector, comprising: a frame having an opening and a plurality of protrusions, the protrusions extending from inner edges of the frame toward the opening; and a pressing assembly having a cover and a buckling piece, the cover being pivotally connected to the frame, and the buckling piece locking the cover to the frame, wherein one end of the cover is pivotally connected to one end of the frame, the buckling piece is pivotally connected to the other end of the cover, wherein the buckling piece has a pivoting plate and a rocking plate, the pivoting plate has a tongue, and the frame includes a blocking plate having an opening therein to interact with the tongue to retain the cover to the frame.

2. The fastener for a socket connector according to claim 1, wherein one end of the cover has a pair of holes, one end of the frame is provided with a pair of connecting portions, the pair of holes is pivotally connected onto the pair of connecting portions.

3. The fastener for a socket connector according to claim 1, wherein one end of the frame has an abutting portion, the top surface of the cover abuts on the abutting portion.

* * * * *